United States Patent [19]

Bergemont

[11] Patent Number: 5,013,674
[45] Date of Patent: May 7, 1991

[54] A METHOD OF MANUFACTURING INTEGRATED CIRCUITS COMPRISING EPROM MEMORY AND LOGIC TRANSISTORS

[75] Inventor: Albert Bergemont, La Tronche, France

[73] Assignee: SGS-Thomson Microelectronics S.A., Gentilly, France

[21] Appl. No.: 464,852

[22] Filed: Jan. 16, 1990

[30] Foreign Application Priority Data

Jan. 17, 1989 [FR] France ................... 89 01227

[51] Int. Cl.⁵ .......................... H01L 21/265
[52] U.S. Cl. .......................... 437/43; 437/27; 437/44; 437/195; 437/49; 437/52
[58] Field of Search ............ 437/43, 54, 52, 27, 437/44; 357/23.5

[56] References Cited

U.S. PATENT DOCUMENTS

| | | | |
|---|---|---|---|
| 4,471,373 | 10/1984 | Shimizu et al. | 357/23.5 |
| 4,651,406 | 3/1987 | Shimizu et al. | 437/52 |
| 4,663,645 | 5/1987 | Komori et al. | 357/23.5 |
| 4,764,479 | 8/1988 | Kosa et al. | 437/52 |
| 4,775,642 | 10/1988 | Chang et al. | 437/44 |

FOREIGN PATENT DOCUMENTS

| | | |
|---|---|---|
| 2618011 | 1/1989 | France . |
| 0050771 | 3/1983 | Japan ................ 437/43 |
| 0184768 | 10/1983 | Japan ................ 437/43 |
| 62-23150(A) | 1/1987 | Japan . |
| 62-101068(A) | 5/1987 | Japan . |
| 2156586A | 10/1985 | United Kingdom . |

Primary Examiner—Brian E. Hearn
Assistant Examiner—Chandra Chaudhari
Attorney, Agent, or Firm—Lowe, Price, LeBlanc, Becker & Shur

[57] ABSTRACT

In a process for manufacturing MOS-type integrated circuits which comprise memory floating gate transistors and logic transistors, sandwiches comprising a polysilicon level, an isolation layer, an additional polysilicon level and an additional isolation layer are formed at the position of the memory area. At the position of the logic transistors, the additional polysilicon level is present. An additional isolation layer is deposited on the whole circuit. The substrate is anisotropically etched and there remains in the additional isolation layer, in the memory area, lateral regions which form with the isolation layer an isolating encapsulation around each sandwich and, in the logic transistors area, spacers.

4 Claims, 3 Drawing Sheets

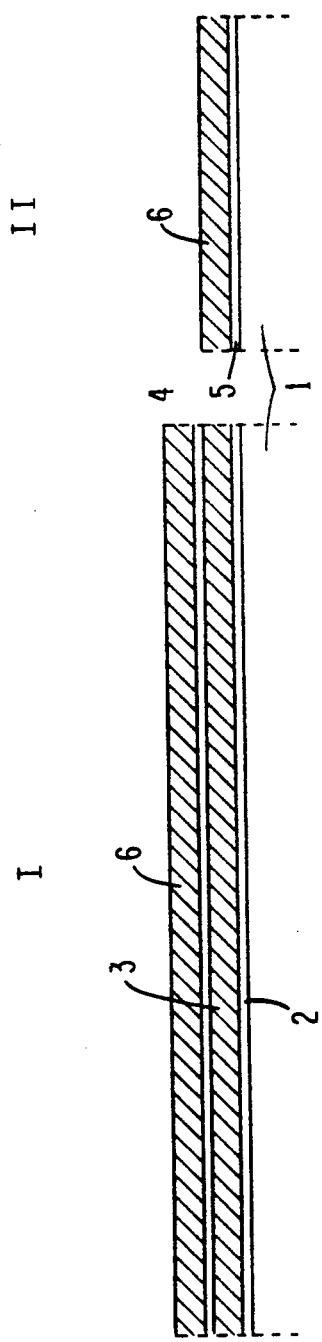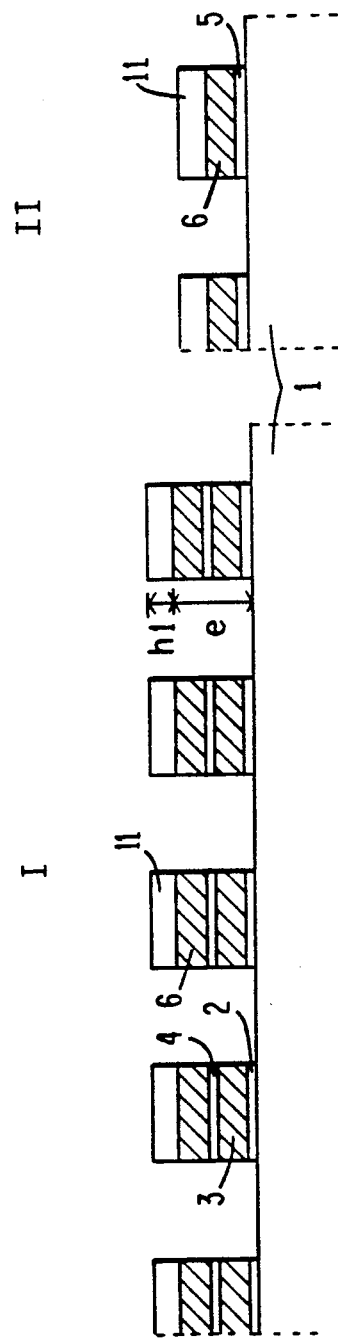

A METHOD OF MANUFACTURING INTEGRATED CIRCUITS COMPRISING EPROM MEMORY AND LOGIC TRANSISTORS

BACKGROUND OF THE INVENTION

The invention relates to the field of manufacturing of MOS-type integrated circuits and more particularly to the manufacturing of integrated circuits comprising electrically programmable non-volatile memory transistors with floating gate (EPROM transistors) and logic transistors.

In such integrated circuits, the floating gates of the EPROM memory transistors are constituted by a first polysilicon level. A gale oxide layer separates those floating gates from the silicon substrate on which the transistors are formed.

Word lines, formed by a second polysilicon level, are arranged above the floating gates and correspond to the control gates of the memory transistors at the position of those transistors. An isolation layer, also called an interpoly oxide layer, is arranged between the word lines and the floating gates.

The logic transistors comprise a gate realized with the second polysilicon level used for forming the word lines of the memory. The gates of the logic transistors are separated from the substrate by a second gate oxide layer, different from the layer arranged under the floating gate of the memory transistors.

The sources and drains of the memory transistors are constituted by highly doped areas. The sources and drains of the logic transistors are formed by two regions. A first low doped region and a second highly doped region included in the first region.

An additional isolation layer is formed and contacts are established through etching of this additional isolation layer. A metal layer is deposited and etched for forming, especially in the memory area, bit lines crossing the word lines, while being isolated from the word lines, and contacting the drains of the memory transistors.

In a conventional manufacturing process, the following distinct steps are successively carried out:

forming the sources and drains of the memory transistors, forming the first low doped region of the sources and drains of the logic transistors.

arranging spacers on the lateral edges of the gates of those logic transistors, and forming the second highly doped region of the sources and drains of the logic transistors.

SUMMARY OF THE INVENTION

The aim of the present invention is to provide for a manufacturing process simultaneously realizing, on the one hand, an isolating encapsulation around the sandwich of polysilicon levels constituting the floating gates and the control gates of the memory transistors and, on the other hand, spacers on the lateral sizes of the logic transistor gates.

The isolating encapsulations form self-aligned contacts with respect to the polysilicon sandwiches they surround and result in increased transistor integration density. Because the isolating encapsulation and the spacers are formed simultaneously, the number of processing steps is reduced.

To achieve those objects, the invention provides for a process for manufacturing MOS-type integrated circuits that comprise memory floating gate transistors and logic transistors, comprising the following steps:

(a) forming thick oxide areas, (b) forming, between the thick oxide areas a first gate oxide layer, and depositing a first polysilicon level and a first isolation layer, (c) etching at the position of the logic transistors the first isolation layer, the first polysilicon level and the first gate oxide layer.

(d) forming a second gate oxide layer and depositing a second polysilicon layer, (e) depositing a second isolation layer, (f) etching at the position of the memory transistors and logic transistors the second isolation layer and the second polysilicon level, (g) etching in the memory area, vertically with respect to the second isolation layer and second polysilicon level that were etched during the preceding step, the first isolation layer and the first polysilicon level, (h) implanting the highly doped sources and drains of the memory transistors, (i) implanting. at the position of the logic transistor sources and drains. a first low doped region (j) eliminating the second isolation layer at the position of the logic transistors, (k) depositing a third isolation layer which is then anisotropically etched on the whole circuit while leaving in the memory area some lateral regions on the lateral edges of the sandwiches of the first and second polysilicon levels and leaving, at the position of the logic transistors, spacers on the lateral edges of the remaining portions of the second polysilicon level.

(l) implanting, at the position of the logic transistor sources and drains, a second highly doped region.

(m) depositing in the memory area a silicon nitride layer, depositing on the whole circuit a fourth isolation layer, forming through etching the fourth isolation layer of the contacts in the memory area and at the position of the logic transistors, the contacts in the memory area being self-aligned with respect to the sandwiches of the first and second polysilicon levels, and depositing a metal layer.

The foregoing and other objects, features and advantages of the invention will be apparent from the following detailed description of a preferred embodiment as illustrated in the accompanying FIGS. 1–6 which show the various steps of a process for manufacturing integrated circuits according to the invention.

BRIEF DESCRIPTION OF THE DRAWINGS

FIG. 1 is a sectional view of a substrate with polysilicon layers formed thereon prior to etching.

FIG. 2 is a sectional view of the substrate after etching to form gate regions.

Figure 3:
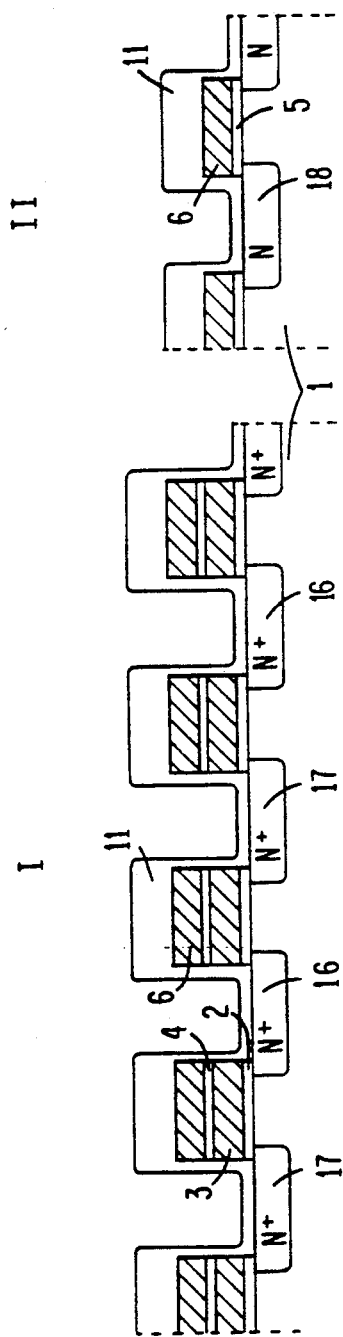
FIG. 3 is a sectional view of the substrate after doping to form source and drain regions between gate regions.

Generally speaking, as conventional in the field of the integrated circuit representation, it will be noted that the various drawings are not drawn to scale either inside one figure or from one figure to the other, and in particular the thicknesses o& the various layers are arbitrarily drawn in order to facilitate the legibility of the drawings.

BEST MODE FOR CARRYING OUT THE INVENTION

FIG. 1 shows, at an intermediate manufacturing step, a view of an integrated circuit comprising EPROM memory floating gate transistors and logic transistors. The components are formed on a substrate 1. Thick oxide regions, not shown in the figures, have been formed. Between each thick oxide region has been formed a first gate oxide layer 2. A first polysilicon level 3 and a first isolation layer 4 have subsequently been deposited. After masking of the memory area (portion I in the figures), the isolation layer 4, the polysilicon layer 3 and the gate oxide layer 2 have been removed in the area of the logic transistors (portion II in the figures). Then the mask has been removed and a second gate oxide layer 5 has been formed on the whole circuit (this second gate oxide layer is mingled in the memory area with the isolation layer 4). A second polysilicon level 6 has then been deposited.

At the step shown in FIG. 2, a second isolation layer 11 has been deposited and, in the area of the memory transistors and logic transistors, this second isolation layer 11 and the second polysilicon level 6 have been etched. Isolation layer 4 and polysilicon layer 3 have been etched in the memory area, vertically with respect to the isolation layer 11 and polysilicon layer 6 etched during the preceding step. Gate oxide layers 2 and 5 have been eliminated in the area of the transistor drains and sources.

At the step shown in FIG. 3, the circuit has been reoxidized. The sources 16 and drains 17, of N+-type doping for example, of the memory transistors have been implanted. A first low doped region 18, of N-type doping for example, forming part of the logic transistor sources and drains has also been implanted.

Figure 4:
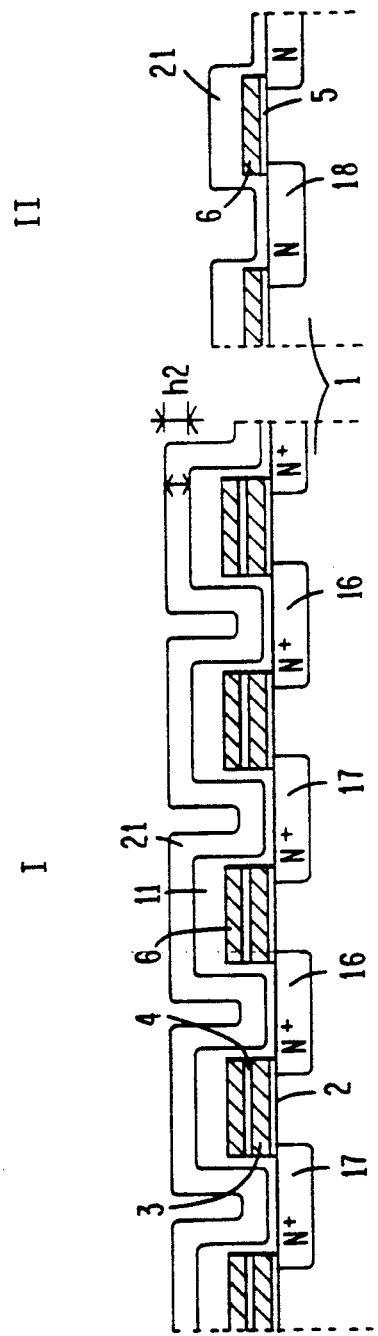
FIG. 4 is a sectional view of the substrate with an isolation region formed over the gate, source and drain regions.

In FIG. 4, the second isolation layer 11 has been eliminated at the position of the logic transistors. A third isolation layer 21 has been deposited on the whole circuit.

Figure 5:
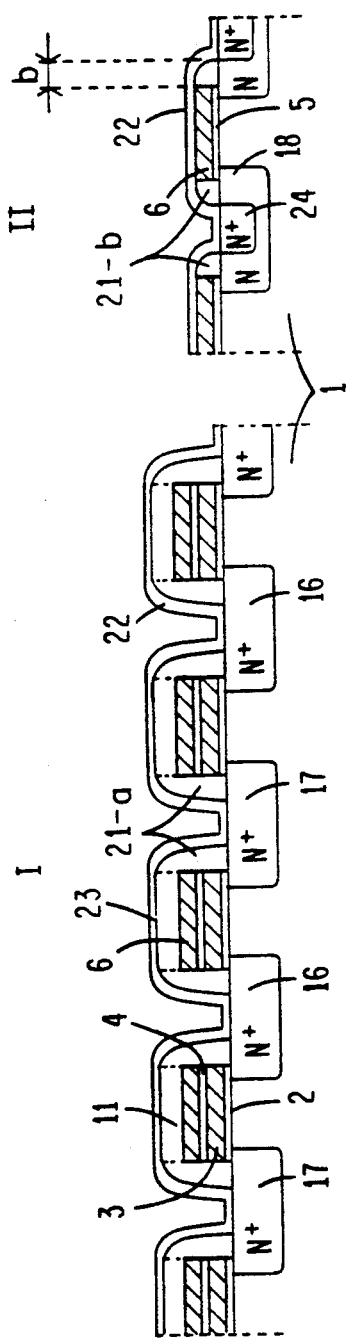
FIG. 5 is a sectional view of the substrate after anisotropic etching.

At the step shown in FIG. 5, the third isolation layer 21 has been anisotropically etched. In the memory area, there remains from this isolation layer 21 some lateral regions 21-a on the lateral edges of the sandwiches formed by the first and second polysilicon levels 3 and 6 and the first and second isolation layers 4 and 11, respectively. At the position of the logic transistors, there remains from the third isolation layer 21 some spacers 21-b on the lateral edges of the remaining portions 6 of polysilicon. An oxidizing step has then been carried out on the whole circuit, wherefrom a thin oxide layer 22 has been formed.

Dotted lines have been added on Fig. 5 to indicate the separation between the lateral regions 21-a and the second isolation layer 11 in the memory area. Lateral regions 21-a and isolation layer 11 form an isolating encapsulation 23 around each sandwich of the polysilicon levels in this memory area.

A second highly doped region 24 has been implanted at the position of the logic transistor sources and drains to complete the formation thereof.

Figure 6:
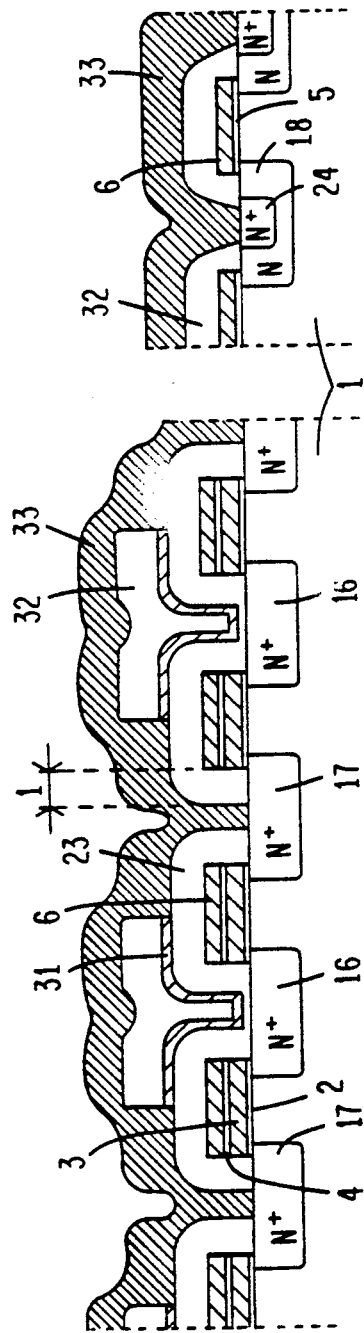
FIG. 6 is a sectional view of the completed integrated circuit including final isolation layers.

At the step shown in FIG. 6, a silicon nitride layer 31 has been deposited in the memory area and a fourth isolation layer 32 has been deposited on the whole circuit. The isolation layer 32 is for example made of boron and phosphorus doped silicon oxide (BPSG) that is made to flow during a thermal process at a temperature of about 800° C. Contacts have been formed through etching of the BPSG layer 32 (in the memory area, the contacts are formed at the transistor drains 17). The BPSG layer is subjected to a new thermal flowing at about 800° C. The silicon nitride layer 31 as well as the oxide that are present at the position of the contacts are eliminated. A metal layer 33 is then deposited.

The contacts formed in the memory area are self-aligned with respect to the sandwiches of the first and second polysilicon levels.

Preferably, the second isolation layer 11 has a thickness h1 (FIG. 2) chosen to optimize the distance 1 (FIG. 6) between the second polysilicon level 6 and the metal layer 33 at the contacts in the memory area. For this purpose, thickness h1 will correspond to about the value of the height e (FIG. 2) of the sandwich comprising the first and second polysilicon levels 3 and 6 and the isolation layer 4. This corresponds to a height e equal for example to 600 nm.

The third isolation layer 21 preferably has a thickness h2 (FIG. 4) chosen to optimize the width b (FIG. 5) of the base of spacers 21-b at the position of the logic transistors.

The preferred embodiment of the method according to the invention described in relation with the figures shows N-channel transistors as logic transistors. The invention is also applicable to integrated circuit having both N-channel logic transistors and P-channel logic transistors such as in the case of a CMOS technology. In that case, low doped regions P are formed at the position of the sources and drains of the P-channel logic transistors after formation of low doped regions N, then highly doped P+-regions are formed after formation of the highly doped P+-regions of the N-channel logic transistors.

Claims:

1. A method of manufacturing MOS-type integrated circuits which comprise memory floating gate transistors and logic transistors, comprising the steps of:
   (a) forming thick oxide areas;
   (b) forming, between the thick oxide areas, a first gate oxide layer, and depositing a first polysilicon layer and a first isolation layer;
   (c) etching, at the position of the logic transistors, (i) the first isolation layer, (ii) the first polysilicon layer, and (iii) the first gate oxide layer;
   (d) forming a second gate oxide layer and depositing a second polysilicon layer;
   (e) depositing a second isolation layer;
   (f) etching, at the position of the memory transistors and logic transistors, the second isolation layer and the second polysilicon layer;
   (g) etching in the memory area, vertically with respect to the second isolation layer and second polysilicon layer eteched during step (f), the first isolation layer and the first polysilicon layer;
   (h) implanting heavily doped sources and drains of the memory transistors;
   (i) implanting, at the position of the logic transistor sources and drains, a first lightly doped region;
   (j) removing the second isolation layer at the position of the logic transistors;
   (k) depositing a third isolation layer which is then anisotropically etched on the whole circuit while leaving in the memory area lateral regions on the lateral edges of sandwiches of the first and second polysilicon layers and leaving, at the position of the logic transistors, spacers on the lateral edges of the remaining portions of the second polysilicon layer;

(l) implanting at the position of the logic transistor sources and drains a second heavily doped region;

(m) depositing in a memory area a silicon nitride layer, depositing on the whole circuit a fourth isolation layer, etching contact regions in the fourth isolation layer in the memory area and at the position of the logic transistors, the contacts in the memory area being self-aligned with respect to the sandwiches of the first and second polysilicon layers, and depositing a metal layer.

2. A method of manufacturing integrated circuits according to claim 1 wherein the second isolation layer has a thickness chosen to optimize the distance between the second polysilicon layer and the metal layer at the contacts in the memory area.

3. A method of manufacturing integrated circuits according to claim 1 wherein the third isolation layer has a thickness chosen to optimize the width of the base of the spacers at the position of the logic transistors.

4. A method of manufacturing integrated circuits according to claim 1 wherein, at step (i), a first group of lightly doped regions of a first conductivity type and a second group of lightly doped regions of a second conductivity type are formed through two successive implantations and wherein, at step (1), a first group of heavily doped regions of the firt conductivity type and a second group of heavily doped regions of the second conductivity type are formed through two successive implantations, forming N-channel logic transistors and P-channel logic transistors of a CMOS technology.

* * * * *